United States Patent
Lee et al.

(10) Patent No.: US 10,120,824 B2
(45) Date of Patent: Nov. 6, 2018

(54) BRIDGE BOARD WITH STRUCTURE FOR PREVENTING SOLID STATE DRIVE MODULE BENDING AND DATA STORAGE DEVICE INCLUDING THE SAME

(71) Applicant: SAMSUNG ELECTRONICS CO., LTD., Suwon-si, Gyeonggi-Do (KR)

(72) Inventors: Han Hong Lee, Suwon-si (KR); Jae Hong Park, Gumi-si (KR); Jung Hyun Woo, Hwaseong-si (KR); Sung Woo Joo, Suwon-si (KR); Chang Hoon Han, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 51 days.

(21) Appl. No.: 15/334,874

(22) Filed: Oct. 26, 2016

(65) Prior Publication Data
US 2017/0293585 A1    Oct. 12, 2017

(30) Foreign Application Priority Data
Apr. 8, 2016   (KR) .................. 10-2016-0043684

(51) Int. Cl.
*G06F 13/40*   (2006.01)
*G06F 13/42*   (2006.01)
(Continued)

(52) U.S. Cl.
CPC .......... *G06F 13/4068* (2013.01); *G06F 13/36* (2013.01); *G06F 13/4027* (2013.01);
(Continued)

(58) Field of Classification Search
None
See application file for complete search history.

(56) References Cited

U.S. PATENT DOCUMENTS 5,742,479 A  *  4/1998  Asakura ............... G06K 13/077
                                              361/728
6,961,238 B2    11/2005  Aketagawa et al.
(Continued)

FOREIGN PATENT DOCUMENTS

CN    2548293 Y  *  4/2003
CN  203759592 U  *  8/2014
(Continued)

OTHER PUBLICATIONS

'Samsung T1 External SSD review: Super small, super light, super fast' by techno-stream.net, Jan. 20, 2015.*
(Continued)

*Primary Examiner* — Steven Snyder
(74) *Attorney, Agent, or Firm* — F. Chau & Associates, LLC

(57) ABSTRACT

A bridge hoard includes a printed circuit board (PCB) and a protocol converter mounted on the PCB to perform a conversion operation converting between a first communication protocol and a second communication protocol different from the first communication protocol. The bridge board further includes a first connector configured to communicate according to the first communication protocol and a second connector configured to communicate according to the second communication protocol. The bridge board additionally includes a hole formed in the PCB. The PCB is shaped as a concave polygon. The concave polygon includes a first region and a second region. The first region includes a first edge and a second edge, which extends in parallel to the first edge, along a first direction. The second region includes a third edge and a fourth edge, which extends in parallel to the third edge, along a second direction perpendicular to the first direction.

21 Claims, 12 Drawing Sheets

(51) Int. Cl.
*G11C 5/02* (2006.01)
*G06F 13/36* (2006.01)
*H01R 12/71* (2011.01)
*H04L 29/06* (2006.01)
*G11C 5/04* (2006.01)

(52) U.S. Cl.
CPC .......... *G06F 13/4282* (2013.01); *G11C 5/025* (2013.01); *H01R 12/716* (2013.01); *H04L 69/08* (2013.01); *G06F 2213/0032* (2013.01); *G06F 2213/0042* (2013.01); *G11C 5/04* (2013.01)

(56) References Cited

U.S. PATENT DOCUMENTS

| | | | |
|---|---|---|---|
| 7,869,218 B2 | 1/2011 | Ni et al. | |
| 8,199,506 B2 | 6/2012 | Janik et al. | |
| 8,271,620 B2* | 9/2012 | Witchey | H04L 69/08 370/467 |
| 9,009,959 B2 | 4/2015 | Schuette | |
| 9,104,384 B2* | 8/2015 | Schade | G06F 1/183 |
| 9,213,377 B2 | 12/2015 | Iwamoto et al. | |
| 2001/0014009 A1* | 8/2001 | Yagenji | G06F 1/184 361/679.33 |
| 2011/0252435 A1 | 10/2011 | Park et al. | |
| 2014/0268588 A1* | 9/2014 | Lee | H05K 9/0024 361/728 |
| 2014/0334089 A1* | 11/2014 | Schade | G06F 1/183 361/679.32 |
| 2015/0146364 A1 | 5/2015 | Chou et al. | |

FOREIGN PATENT DOCUMENTS

| | | | |
|---|---|---|---|
| CN | 204669531 U | * | 9/2015 |
| CN | 106169041 A | * | 11/2016 |
| JP | 2000-165069 | | 6/2000 |
| JP | 2007-250772 | | 9/2007 |
| JP | 2012-156465 | | 8/2012 |

OTHER PUBLICATIONS

'How to Fix a Hard Drive PCB Board' by HDDzone.com, archived on Mar. 30, 2015.*
'WD Black2 SSD/HDD Review' by Kevin OBrien at storagereview.com, Nov. 25, 2013.*
'The Circuit Board—Custom PCB shapes' by Paul Jackson, Aug. 22, 2013.*
'Rosewill RDEE-12002 USB 3.0 Hard Drive Enclosure Review' by Darksaber on May 7, 2013.*

* cited by examiner

US 10,120,824 B2

BRIDGE BOARD WITH STRUCTURE FOR PREVENTING SOLID STATE DRIVE MODULE BENDING AND DATA STORAGE DEVICE INCLUDING THE SAME

CROSS-REFERENCE TO RELATED APPLICATION

This application claims priority under 35 U.S.C. § 119 to Korean Patent Application No. 10-2016-0043684 filed on Apr. 8, 2016, the disclosure of which is incorporated by reference herein in its entirety.

TECHNICAL FIELD

Exemplary embodiments of the present inventive concept relate to a data storage device, and more particularly, to a bridge board having a structure for preventing a solid state drive (SSD) module from bending and a data storage device including the same.

DISCUSSION OF THE RELATED ART

A solid state drive (SSD) is a storage device comprising memory chips, as opposed to a spinning disk, that is commonly found in standard hard disk drives (HDD). SSDs may be available either as a single memory card or an enclosed device in which the memory card is coupled to a quadrangular bridge board. When the SSD is so provided, the length of the SSD is larger than where only the SSD memory card exists. As a result of this longer length, the center of the SSD module may be prone to bending due to an external impact or strong force. To prevent the bending of the SSD module, the SSD module may be affixed to a rigid bracket. Since physical dimensions of an SSD module have been defined for mini serial advanced technology architecture (mSATA) type SSD modules, there is not sufficient space for the center of an SSD module to be fixed to a bracket, and thus the SSD module may remain prone to structural failure.

A conventional external storage device including an SSD module has a structure in which the side of the SSD module is fixed to a bracket using a hook. In addition, the SSD is generally protected from impact by disposing an elastic rubber material around its exterior. However, when a strong force is applied to the SSD module or an external storage device incorporating the SSD module, the SSD module is not adequately protected from bending. As a result, the mechanical reliability of the SSD decreases. Additionally, the size of a bridge board coupled to the SSD module is increased, the size and thickness of the external storage device incorporating the SSD module is also increased.

SUMMARY

According to an exemplary embodiment of the present inventive concept, a bridge board includes a printed circuit board (PCB) and a protocol converter mounted on the PCB to perform a conversion operation converting between a first communication protocol and a second communication protocol different from the first communication protocol. The bridge board further includes a first connector configured to communicate according to the first communication protocol and a second connector configured to communicate according to the second communication protocol. The bridge board additionally includes a hole formed in the PCB. The PCB is shaped as a concave polygon. The concave polygon includes a first region and a second region. The first region includes a first edge and a second edge, which extends in parallel to the first edge, along a first direction. The second region includes a third edge and a fourth edge, which extends in parallel to the third edge, along a second direction perpendicular to the first direction. A ratio of a second length of the second edge to a first length of the first edge is equal to or greater than 0.45 and equal to or less than 0.75, and a ratio of a fourth length of the fourth edge to a third length of the third edge is equal to or greater than 0.35 and equal to or less than 0.7.

According an exemplary embodiment of the present inventive concept, a data storage device includes a bridge board including a first connector. The data storage device further includes a data storage board connected to the first connector. The bridge board includes a printed circuit board (PCB) and a second connector. The bridge board further includes a protocol converter mounted on the PCB to perform a conversion operation converting between a first communication protocol used by the first connector and a second communication protocol used by the second connector. The second communication protocol is different from the first communication protocol. The bridge board additionally includes a hole formed in the PCB. The PCB has a shape of a concave polygon, and the concave polygon includes a first region and second region. The first region includes a first edge and a second edge, which extends in parallel to the first edge, along a first direction. The second region includes a third edge and a fourth edge, which extends in parallel to the third edge, along a second direction perpendicular to the first direction. A ratio of a second length of the second edge to a first length of the first edge is equal to or greater than 0.45 and equal to or less than 0.75, and a ratio of a fourth length of the fourth edge to a third length of the third edge is equal to or greater than 0.35 and equal to or less than 0.7.

According to an exemplary embodiment of the present inventive concept, a data storage device includes a bridge board including a first connector. The data storage device further includes at least one damper coupled to a data storage board. The data storage hoard includes at least one hole. The data storage device further includes the data storage board connected to the first connector. The bridge board includes a printed circuit board (PCB) and a second connector. The bridge board further includes a protocol converter mounted on the PCB to perform a conversion operation converting between a first communication protocol used by the first connector and a second communication protocol used by the second connector. The second communication protocol is different from the first communication protocol. The bridge board additionally includes a first hole formed in the PCB. The PCB has a shape of a concave polygon. The concave polygon includes a first region and a second region. The first region includes a first edge and a second edge, which extends in parallel to the first edge, along a first direction. The second region includes a third edge and a fourth edge, which extends in parallel to the third edge, along a second direction perpendicular to the first direction. A ratio of a second length of the second edge to a first length of the first edge is equal to or less than 0.75, and a ratio of a fourth length of the fourth edge to a third length of the third edge is equal to or less than 0.7.

BRIEF DESCRIPTION OF THE DRAWINGS

The above and other features and aspects of the present inventive concept will become more apparent by describing in detail exemplary embodiments thereof with reference to the accompanying drawings, in which.

DETAILED DESCRIPTION OF THE EMBODIMENTS

Exemplary embodiments of the present inventive concept will now be described more fully hereinafter with reference to the accompanying drawings. The present disclosure may, however, be embodied in many different forms and should not be construed as limited to the exemplary embodiments set forth herein. It will be understood that when an element is referred to as being "connected" or "coupled" to another element, it can be directly connected or coupled to the other element or intervening elements may be present.

As used herein, a bridge board is a board which is used to manage ("bridge") a connection between a host device connected through a first type of interface and a slave device through a second interface of a different type than the first interface. In this way, the bridge board includes logic for interpreting and communicating instructions between two different interfaces. A solid state drive (SSD) module may include a memory board (or a device) which includes a plurality of flash memory chips (or packages) and a controller for controlling the flash memory chips.

Figure 1:
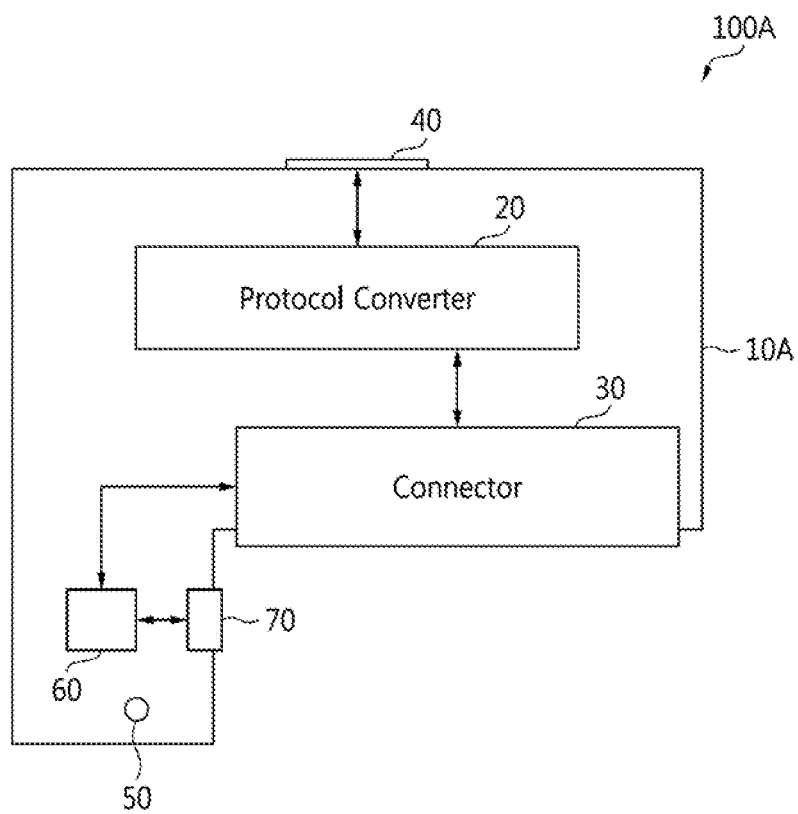
FIG. 1 is a block diagram of a bridge board according to an exemplary embodiment of the present inventive concept.

FIG. 1 is a block diagram of a bridge board according to an exemplary embodiment of the present inventive concept. The bridge board 100A may include a printed circuit board (PCB) 10A, a protocol converter 20, a first connector 30, a second connector 40, and a hole 50. The bridge board 100A may also include a peripheral circuit 60 and a third connector 70. The bridge board 100A may be coupled to an SSD module through the first connector 30. The PCB 10A may be shaped similarly to a concave polygon. For example, the PCB 10A may be substantially L-shaped.

The protocol converter 20 may be mounted on the PCB 10A and may perform a conversion between a first communication protocol and a second communication protocol. For example, the protocol converter 20 may perform a protocol conversion operation between the first connector 30, which performs communication according to the first communication protocol (or a first interface), and the second connector 40 which performs communication according to the second communication protocol (or a second interface). The first communication protocol may be a serial advanced technology architecture (SATA) protocol and the second communication protocol may be a universal serial bus (USB) protocol, an advanced technology architecture (ATA) protocol, or an integrated drive electronics (IDE) protocol, but the first and second communication protocols are not restricted to these examples, and may be any two different communications protocols, or even two different versions of a same communications protocol.

Figure 9:
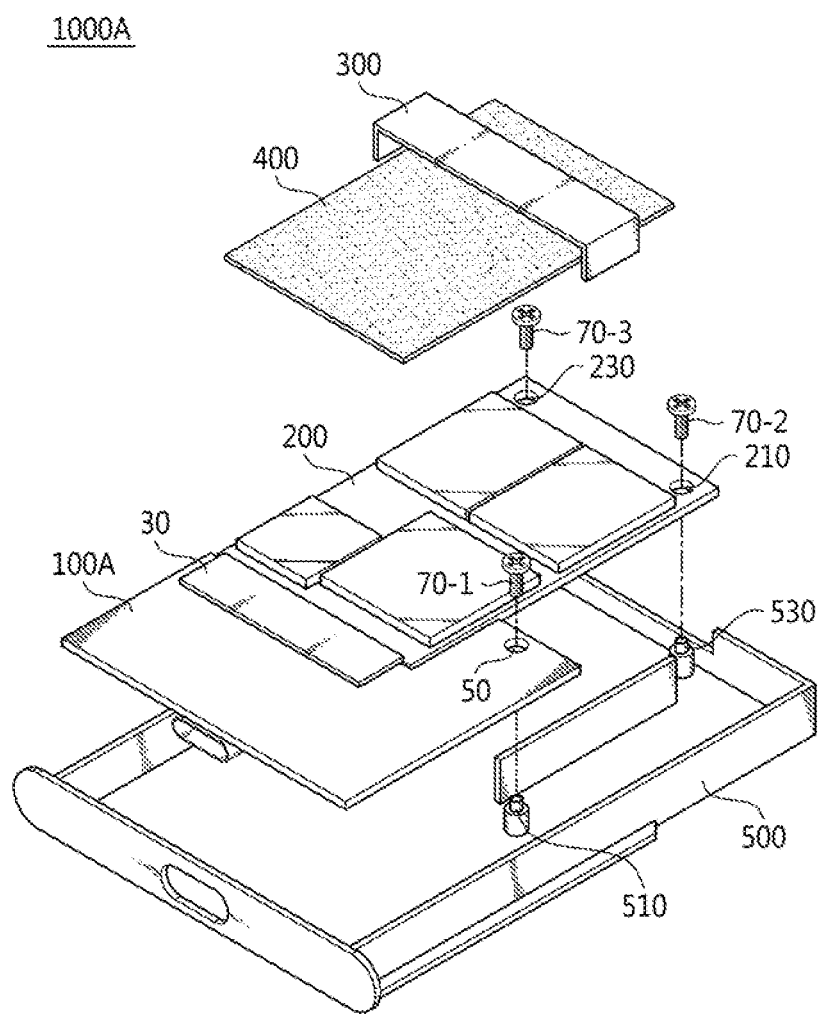
FIGS. 9 and 10 are perspective views of a data storage device according to an exemplary embodiment of the present inventive concept.

Referring to FIGS. 1 and 9, a screw 70-1 (e.g., as illustrated in FIG. 9) may pass through the hole 50 formed in the PCB 10A and fit into a tapped hole 510 (e.g., as illustrated in FIG. 9) in a bracket 500 (e.g., as illustrated in FIG. 9). The hole 50 may fax the PCB 10A to the bracket 500, so that an SSD module is prevented from bending or otherwise deviating from its original shape when an external force is applied thereto. For example, by applying a strong impact to the SSD such as by striking or dropping the device.

The PCB 10A may have an L-shape, or something substantially similar to an L-shape. When the peripheral circuit 60 is disposed in the PCB 10A having the L-shape, the peripheral circuit 60 may be mounted on a space which is additionally secured. For example, additional circuits may be placed in the additionally-secured space of the peripheral circuit 60.

When a data storage device including the bridge board 100A and an SSD module is first connected to a host device, peak current flows from the data storage device to the host device. Therefore, an instantaneous voltage drop may occur in the host device. As a result, the power of the host device may be instantaneously turned off. Accordingly, the peripheral circuit 60 placed in the PCB 10A may act to reduce the peak current and to prevent the power of the host device from being turned off and to reduce the peak current. The peripheral circuit 60 may communicate data signals with the SSD module through at least one connector among the first and third connectors 30 and 70.

Figure 2:
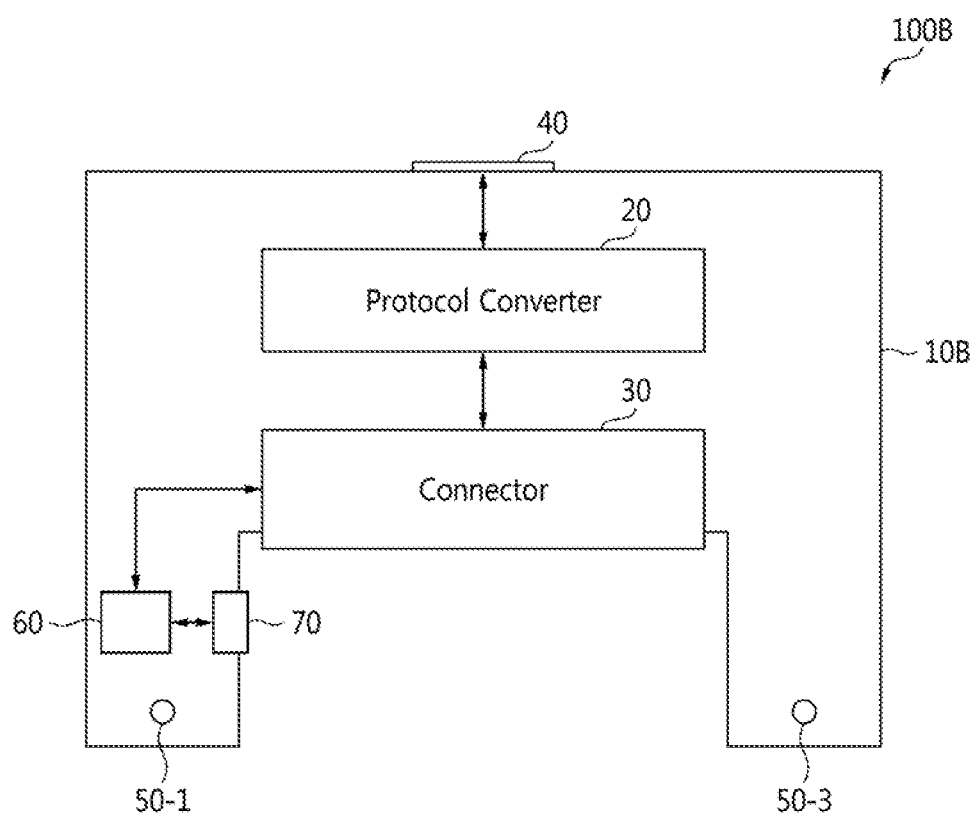
FIG. 2 is a block diagram of a bridge board according to an exemplary embodiment of the present inventive concept.

FIG. 2 is a block diagram of a bridge board according to an exemplary embodiment of the present inventive concept. The structure of the bridge board 100B (illustrated in FIG. 2) is the same as or similar to that of the bridge board 100A (e.g., as illustrated in FIG. 1), except for the shape of a PCB 10B and the number and positions of holes 50-1 and 50-3. Referring to FIG. 2, the PCB 10B may have a concave polygon shape, or a shape similar to it. For example, the PCB 10B may have a U-shape.

Figure 5:
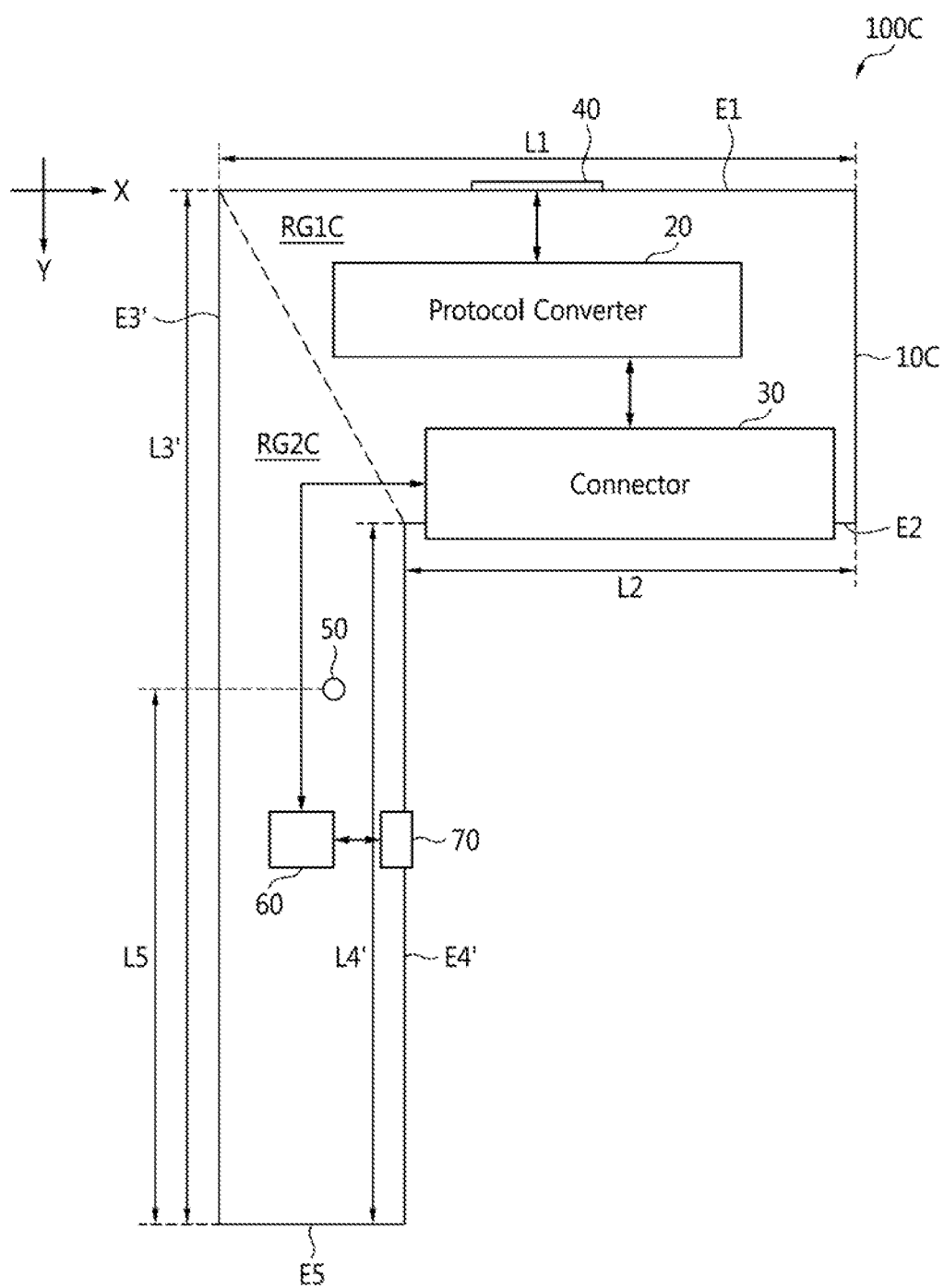
FIG. 5 is a diagram showing the position of a hole included in a bridge board according to an exemplary embodiment of the present inventive concept.

Although a data storage device 1000A (e.g., as illustrated in FIG. 9) includes the L-shaped bridge board 100A (e.g., as illustrated in FIG. 1), the data storage device 1000A may alternatively include the bridge board 100B or 100C illustrated in FIG. 2 or 5. The data storage device 1000A may include screws and tapped holes which are formed in the bracket 500 to be fastened with the screws according to the number of the holes 50-1 and 50-3 formed in the PCB 10B.

Referring to FIGS. 2 and 9, when the bridge board 100B is formed in U-shape or something substantially similar to a U-shape as shown in FIG. 2; screws may pass through the holes 50-1 and 50-3, respectively, and enter the tapped holes, respectively, in the bracket 500. Once the screws have entered into the tapped holes, the screws may be fastened within the tapped holes. When the screws are fastened in the tapped holes in the bracket 500 through the holes 50-1 and 50-3, the PCB 10B becomes fixed to the bracket 500. Thus, bending of the PCB 10B including the holes 50-1 and 50-3 is prevented.

Figure 3:
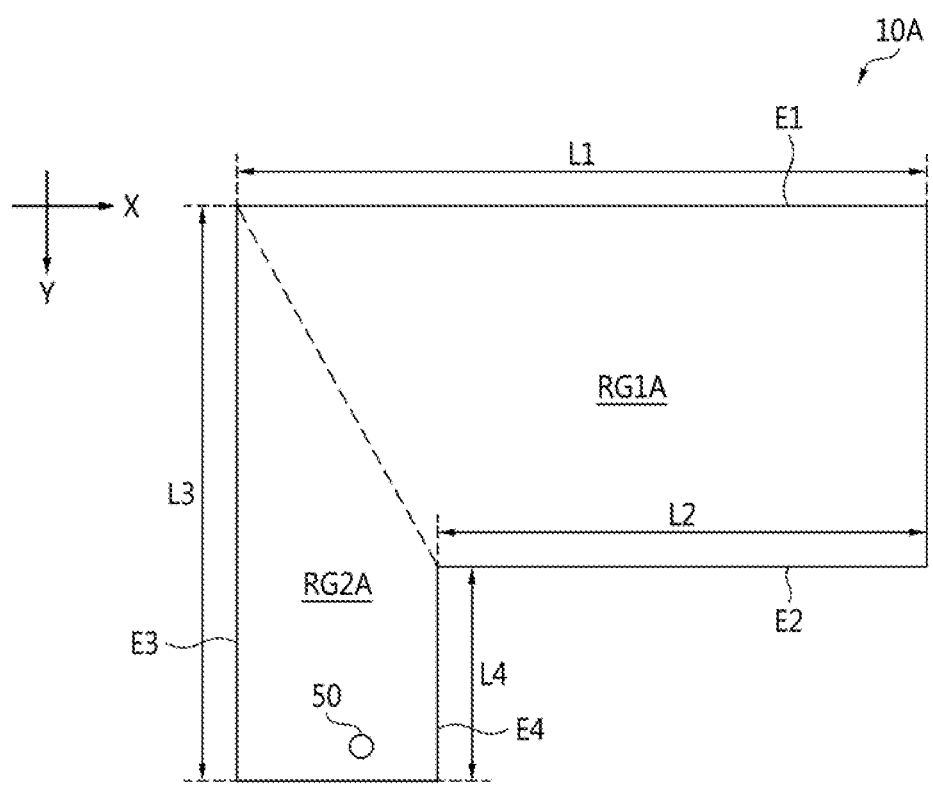
FIG. 3 is a conceptual diagram of the shape of a printed circuit board (PCB) illustrated in FIG. 1 according to an exemplary embodiment of the present inventive concept.

FIG. 3 is a conceptual diagram of the shape of the PCB 10A (e.g., as illustrated in FIG. 1). Referring to FIGS. 1 and 3, when the PCB 10A has an L-shape, the PCB 10A may include a first region RG1A including a first edge E1 and a second edge E2 which extend in parallel to each other along a first direction (e.g., an X-axis direction). The PCB 10A may further include a second region RG2A including a third edge E3 and a fourth edge E4 which extend in parallel to each other along a second direction (e.g., a Y-axis direction) substantially perpendicular to the first direction. Although the first and second regions RG1A and RG2A are defined in the description with the edges E1 through E4 in the exemplary embodiment of the present inventive concept illustrated in FIG. 3, the inventive concept is not restricted to the current exemplary embodiment.

For example, a ratio of a second length L2 of the second edge E2 to a first length L1 of the first edge E1, e.g., L2/L1 is equal to or greater than 0.45 and equal to and less than 0.75; a ratio of a fourth length L4 of the fourth edge E4 to a third length L3 of the third edge E3, e.g., L4/L3 is equal to or greater than 0.35 and equal to and less than 0.7.

As shown in FIG. 3, the PCB 10A has a shape (e.g., an L-shape) where an SSD module (e.g., as illustrated as 200 in FIG. 6) may be connected to the center of the PCB 10A, and the PCB 10A may be fixed to a bracket so that the center of the SSD module is prevented from bending when an external force is applied thereto. For example, applying a strong impact to the SSD such as by striking or dropping the device.

Figure 4:
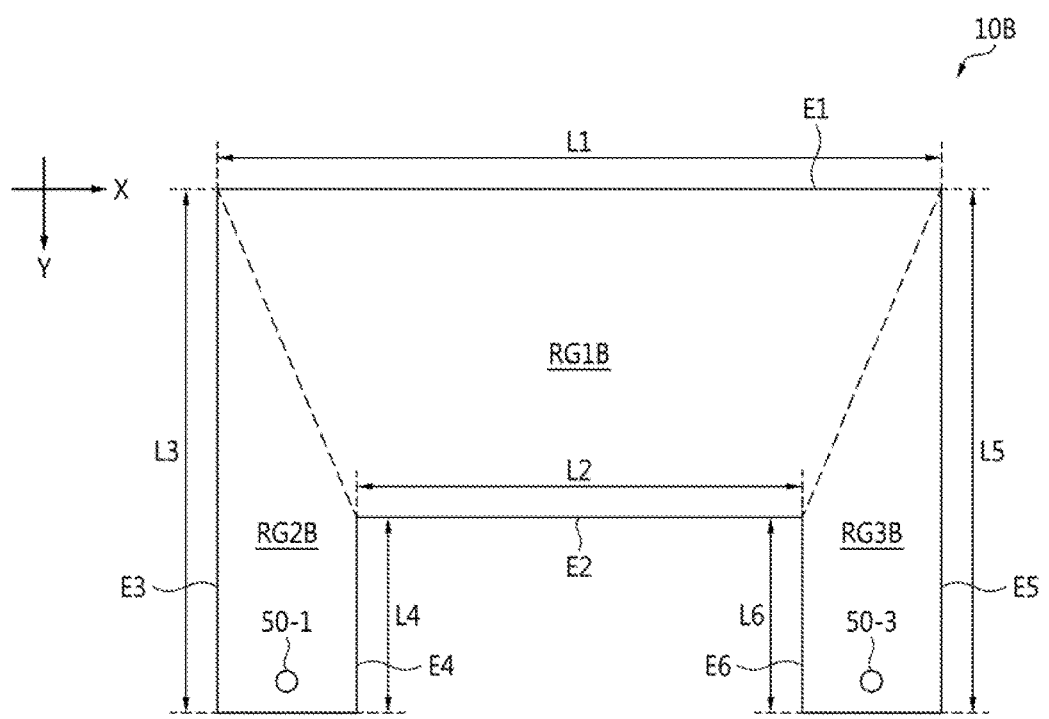
FIG. 4 is a conceptual diagram of the shape of a PCB illustrated in FIG. 2 according to an exemplary embodiment of the present inventive concept.

FIG. 4 is a conceptual diagram of the shape of the PCB 10B (e.g., as illustrated in FIG. 2). Referring to FIGS. 2 and 4, when the PCB 10B has a U-shape, the PCB 10B may include a first region RG1B, a second region RG2B, and a third region RG3B.

The first region RG1B may include the first edge E1 and the second edge E2 which extend in parallel to each other along the first direction (e.g., the X-axis direction). The second region RG2B may include the third edge E3 and the fourth edge E4 which extend in parallel to each other along the second direction (e.g., the Y-axis direction) substantially perpendicular to the first direction. The third region RG3B may include a fifth edge E5 and a sixth edge E6 which extend in parallel to each other along the second direction (e.g., the Y-axis direction) substantially perpendicular to the first direction (e.g., the X-axis direction). The second region RG2B and the third region RG3B are symmetrical to each other with respect to the second direction.

For example, the ratio of the second length L2 of the second edge E2 to the first length L1 of the first edge E1, e.g., L2/L1 is equal to or greater than 0.45 and equal to and less than 0.75; the ratio of the fourth length L4 of the fourth edge E4 to the third length L3 of the third edge E3, e.g., L4/L3 is equal to or greater than 0.35 and equal to and less than 0.7. Here, the second length L2 is a distance between the fourth edge E4 and the sixth edge E6. In addition, the fifth length L5 is the length for the fifth edge E5 and the sixth length L6 is the length for the sixth edge E6.

FIG. 5 is a diagram showing the position of the hole included in a bridge board according to an exemplary embodiment of the present inventive concept. Referring to FIG. 5, the bridge board 100C may include a PCB 10C, the protocol converter 20, the first connector 30, the second connector 40, and the hole 50. The bridge board 100C may also include the peripheral circuit 60 and the third connector 70. The PCB 10C may have a concave polygon shape, e.g., an L-shape.

When the PCB 10C has an L-shape, the PCB 10C may include a first region RG1C including the first edge E1 and the second edge E2 which extend in parallel to each other along the first direction (e.g., the X-axis direction). The PCB 10C may further include a second region RG2C including a third edge E3' and a fourth edge E4' which extend in parallel to each other along the second direction (e.g., Y-axis direction) substantially perpendicular to the first direction (e.g., the X-axis direction). For example, the third length L3' may be greater than the first length L1, and the fourth length L4' may be greater than the second length L2. Comparing the shape of the PCB 10A (e.g., illustrated in FIG. 3) with the shape of the PCB 10C (illustrated in FIG. 5), the length of the second region RG2C including the third and fourth edges E3' and E4' illustrated in FIG. 5 is longer than that of the second region RG2A including the third and fourth edges E3 and E4 illustrated in FIG. 3.

The hole 50 may be formed in the second region RG2C. The second region RG2C may be defined by the third and fourth edges E3' and E4' and may include the fifth edge E5 extending in the first direction (e.g., the X-axis direction). The third edge E3' may have a length equal to L3'. In addition, the hole may be positioned at a length equal to L5 from the bottom of the second region RG2C where the fifth edge E5 extends. For example, a position of the hole 50 which corresponds to a ratio of the fifth length L5 to a third length L3', e.g., L5/L3' is equal to or greater than 0.3 and equal to or less than 0.7.

Figure 6:
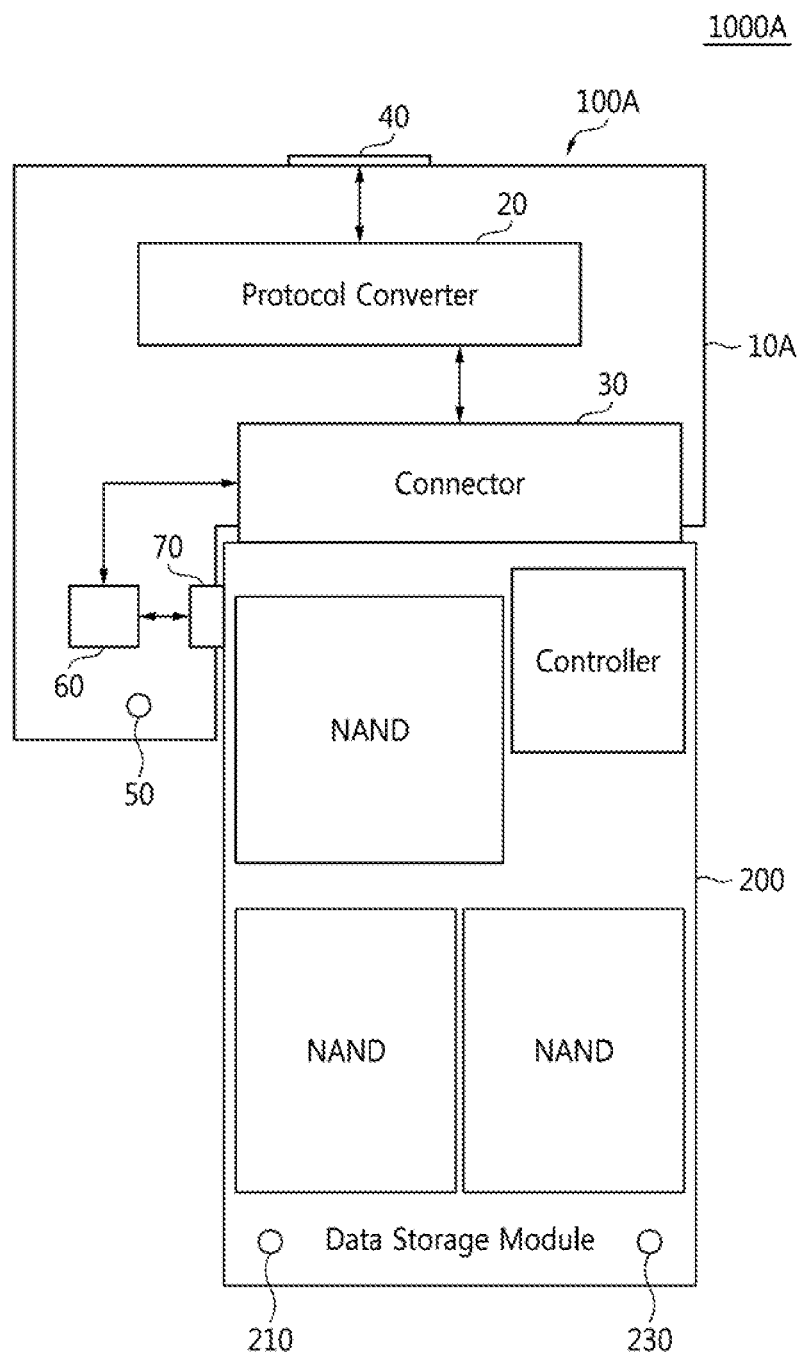
FIGS. 6, 7 and 8 are schematic block diagrams of a data storage device including a bridge board according to an exemplary embodiment of the present inventive concept.
Figure 7:
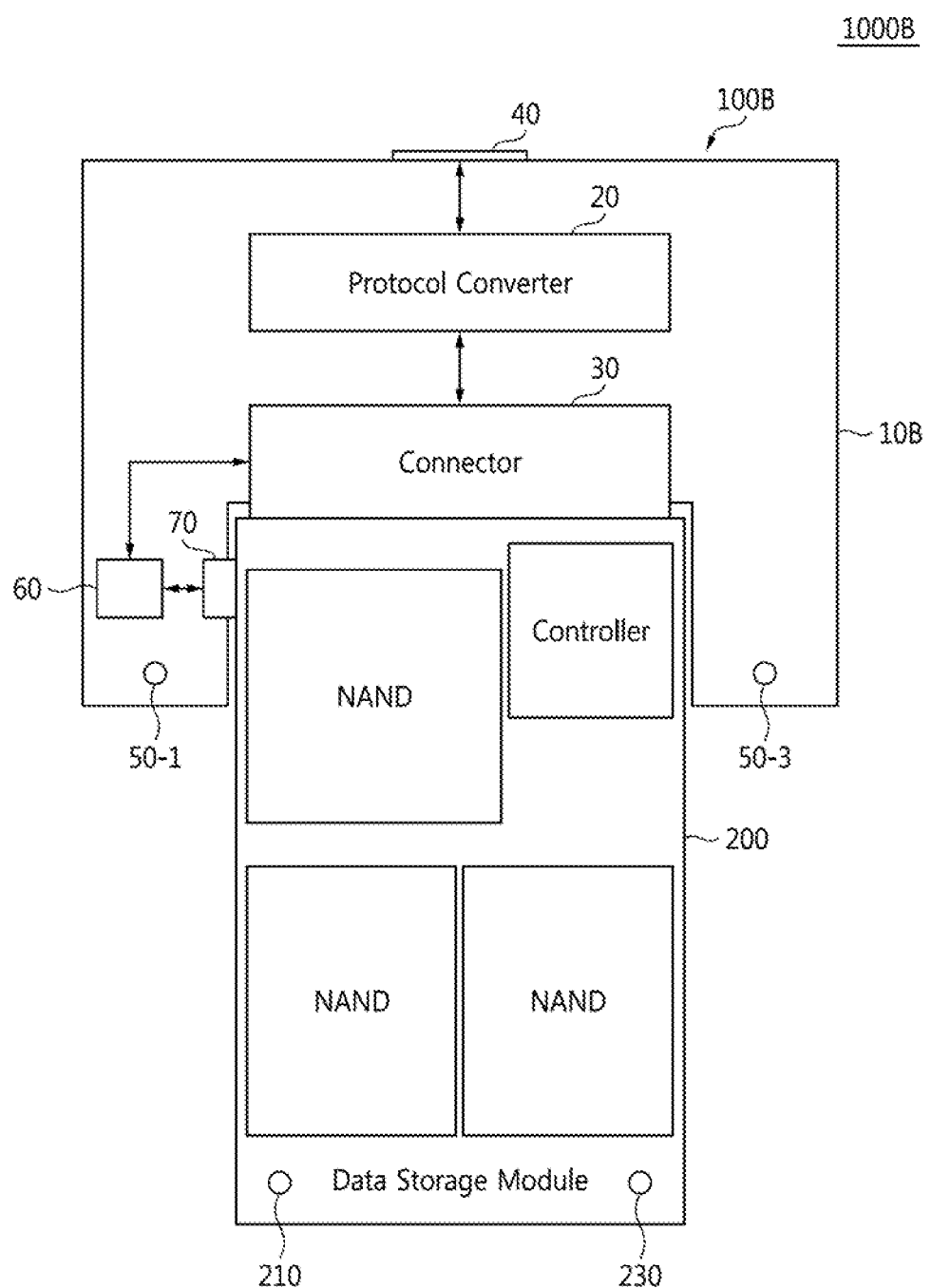
Figure 8:
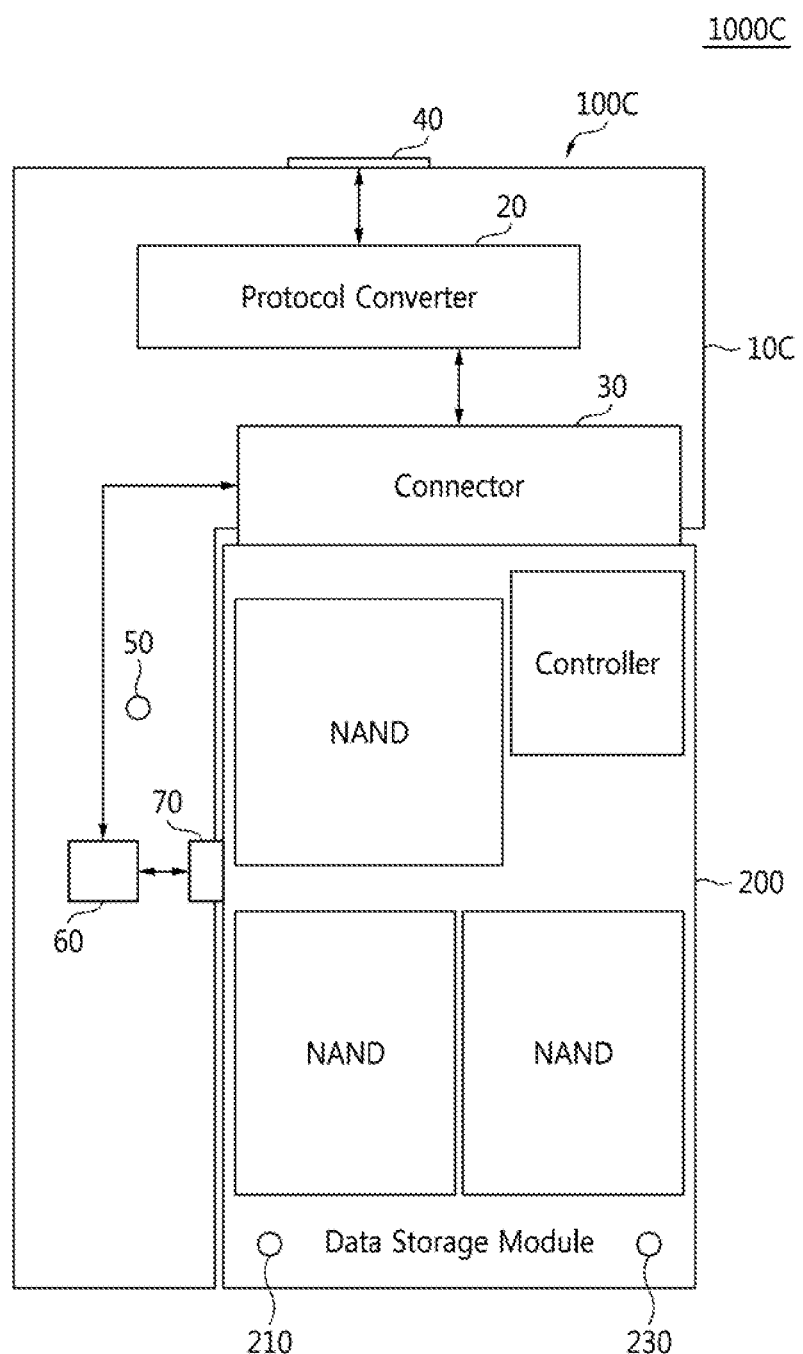

FIGS. 6, 7 and 8 are schematic block diagrams of a data storage device including a bridge board according to an exemplary embodiment of the present inventive concept. Referring to FIG. 6, the data storage device 1000A may include the bridge board 100A including the first connector 30 (e.g., as illustrated in FIG. 1) and the data storage board 200 connected to the first connector 30. The data storage board 200 may be implemented as an SSD module. For example, the data storage board 200 may include a plurality of NAND flash memory devices, a controller for controlling the operation of the NAND flash memory devices, and a data storage board-side connector to connect the data storage board 200 to the first connector 30.

When the PCB 10A has an L-shape or another shape substantially similar to an L-shape, the screw 70-1 (e.g., as illustrated in FIG. 9) may pass through the hole 50 formed in the PCB 10A and enter the tapped hole 510 (e.g., as illustrated in FIG. 9) in the bracket 500 (e.g., as illustrated in FIG. 9). Once the screw has entered into the tapped hole 510, it may be fastened within it (e.g., the screw 70-1 is screwed into the tapped hole 510). Accordingly, when the screw is fastened in the tapped hole 510 in the bracket 500, the bridge board 100A connected with the data storage board 200 is sturdily fixed at the bracket 500 by the screw 70-1. As a result, bending of the data storage board 200 is prevented when an external force is applied to the data storage device 1000A. For example, applying a strong impact to the data storage device 1000A such as by striking or dropping the device.

The structure of the connection between the third connector 70 and the data storage board 200 will be described in detail below with reference to FIG. 14.

Referring to FIG. 7, a data storage device 1000B may include the bridge board 100B including the first connector 30 (e.g., as illustrated in FIG. 2) and the data storage board 200 connected to the first connector 30 and the third connector 70.

When the PCB 10B has a U-shape or another shape substantially similar to an L-shape, screws may pass through the holes 50-1 and 50-3 formed in the PCB 10B and be fastened into tapped holes in a bracket. Accordingly, when the screws are fastened in the tapped hole, the bridge board 100B connected with the data storage board 200 is sturdily fixed at the bracket by the screws. As a result, bending of the data storage board 200 is prevented when an external force is applied to the data storage device 1000B. For example, applying a strong impact to the data storage device 1000B such as by striking or dropping the device.

Referring to FIG. 8, a data storage device 1000C may include the bridge board 100C including the first connector 30 (e.g., as illustrated in FIG. 5) and the data storage board 200 connected to the first connector 30.

When the PCB 10C has an L-shape or another shape substantially similar to an L-shape, the screw 70-1 (e.g., as illustrated in FIG. 9) may pass through the hole 50 formed in the PCB 10C and be fastened into the tapped hole 510 in the bracket 500. Accordingly, when the screw is fastened in the tapped hole, the bridge board 100C connected with the data storage board 200 is sturdily fixed at the bracket 500 by the screw 70-1. As a result, bending of the data storage board 200 is prevented when an external force is applied to the data storage device 1000C. For example, applying a strong impact to the data storage device 1000C such as by striking or dropping the device.

The data storage board 200 (e.g., as illustrated in FIGS. 6, 7 and 8) may be a mini serial advanced technology architecture (mSATA) type SSD module but is not restricted thereto. The data storage board 200 may include a plurality of the NAND flash memory devices. At least one of the NAND flash memory devices may include a three-dimensional memory cell array.

The data storage board 200 may include holes 210 and 230. Screws 70-2 and 70-3 (e.g., as illustrated in FIG. 9) may pass through the holes 210 and 230, respectively, and enter the tapped holes 530, respectively, in the bracket 500. Once the screws 70-2 and 70-3 have entered into the tapped holes 530, the screws may be fastened within the tapped holes (e.g., the screws 70-2 and 70-3 are screwed into the tapped holes 530).

Figure 10:
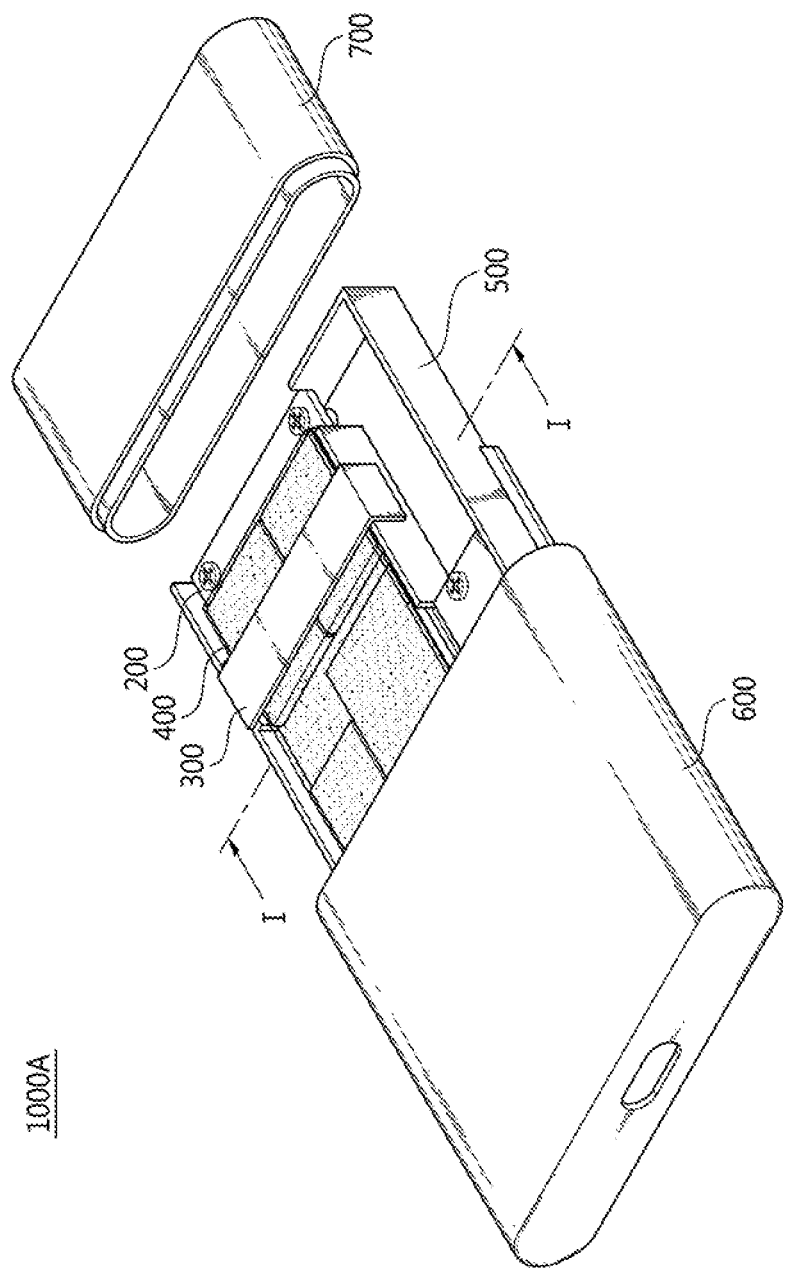

FIGS. 9 and 10 are perspective views of the data storage device according to exemplary embodiments of the present inventive concept. Except for the shape of the PCB 10A, 10B, or 10C and the position and number of the holes 50, 50-1, and/or 50-3, the data storage devices 1000A, 1000B, and 1000C have substantially the same structure as or a similar structure to one another.

Referring to FIG. 9, the data storage device 1000A may also include a SUS plate 300, a damper 400, the bracket 500, and the screws 70-1 through 70-3. The bracket 500 may include the tapped holes 510 and 530. The data storage board 200 may be connected to the bridge board 100A through the first connector 30 and may be fixed to the bracket 500 using the screws 70-1 through 70-3. The screw 70-1 may pass through the hole 50 and may be fastened in the tapped hole 510.

According to an exemplary embodiment of the present inventive concept, the data storage device 1000A may have the bridge board 100A modified to have a concave polygon shape, e.g., an L-shape, so that at the center of the data storage device 1000A, the bridge board 100A is sturdily fixed at the bracket 500 while still sustaining the fundamental structure of the data storage board 200. In addition, since bending of the data storage board 200 is minimized even when an external force is applied to the data storage device 1000A, the mechanical reliability of the data storage device 1000A is increased. For example, the screws 70-2 and 70-3 may pass through the holes 210 and 230, respectively, and may be fastened into the tapped holes 530, respectively.

The damper 400 may be coupled to the data storage board 200. The damper 400 may absorb an external force applied to the data storage device 1000A, thereby minimizing the propagation of the external force to the data storage board 200.

The SUS plate 300 may be fixed to the bracket 500 to surround at least part of the data storage board 200. The SUS plate 300 may protect the data storage board 200. Accordingly, the SUS plate 300 may protect the data storage board 200 from an external force delivered through a case body 600 and/or a case cap 700 (e.g., as illustrated in FIG. 10). The SUS plate 300 may also minimize bending of the data storage board 200.

Although the data storage device 1000A includes the bridge board 100A (e.g., as illustrated in FIG. 1) in an exemplary embodiment of the present inventive concept illustrated in FIG. 9, a data storage device may include the bridge board 100B or 100C (e.g., as illustrated in FIG. 2 or 5) and the data storage board 200 connected to the bridge board 100B or 100C in other exemplary embodiments of the present inventive concept.

Referring to FIG. 10, the data storage device 1000A may also include the case body 600 and the case cap 700. The data storage device 1000A (e.g., as illustrated in FIG. 9) may be inserted into the case body 600. For example, the case body 600 may be made of metal.

The case cap 700 may be removable from and capable of being coupled to the case body 600. The case cap 700 may be made of, for example, plastic. When the ease cap 700 is made of plastic, it may be bent or deformed by an external force. The SUS plate 300 may reduce a gap between the case cap 700 and the data storage board 200, thereby preventing the case cap 700 from being bent by an external force, and mitigating the external force delivered to the data storage board 200.

Figure 11:
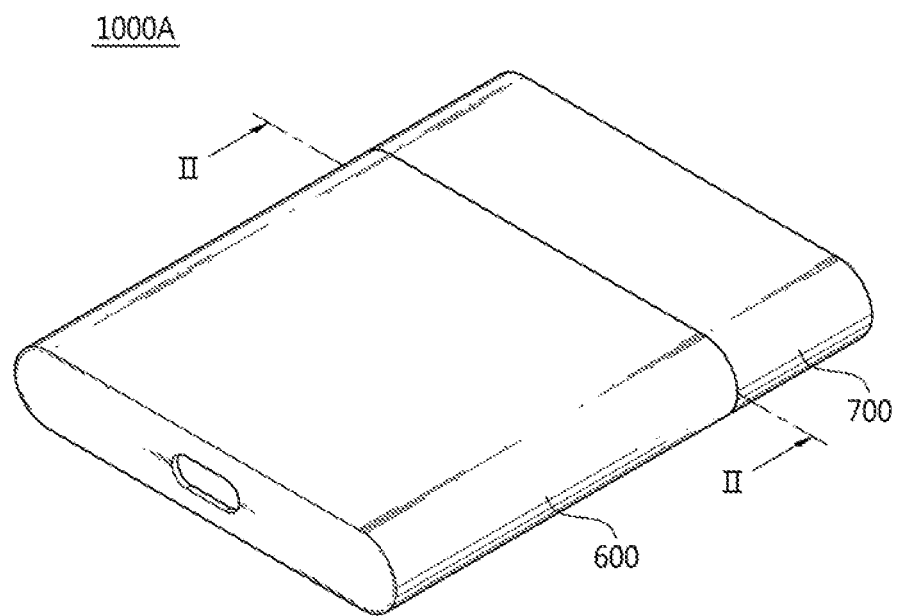
FIG. 11 is a perspective view of a housing for the data storage device, where the data storage device is between the case body and the case cap according to an exemplary embodiment of the present inventive concept.

FIG. 11 is a perspective view of the data storage device housed between the case body and the case cap. Referring to FIGS. 9, 10 and 11, the data storage device 1000A (e.g., as illustrated in FIG. 9) is inserted into the case body 600 and the case cap 700 is coupled to the case body 600, so that a single SSD device is built.

Figure 12:
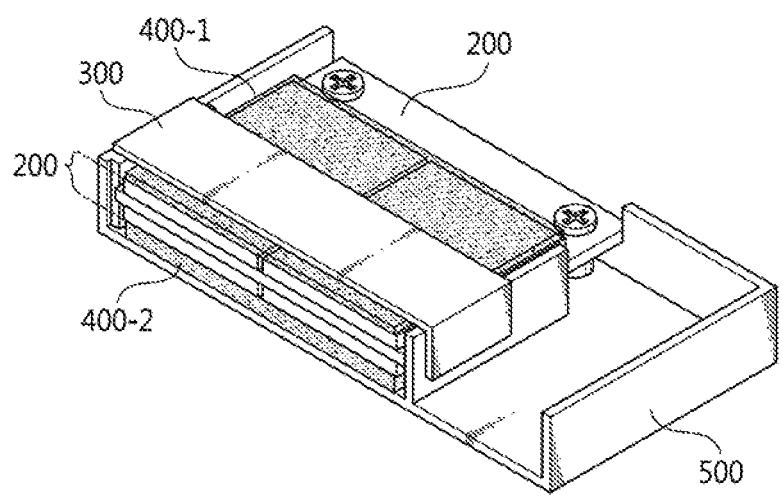
FIG. 12 illustrates the cross-section of the data storage device illustrated in FIG. 10, taken along the I-I direction, according to an exemplary embodiment of the present inventive concept.

FIG. 12 illustrates the cross-section of the data storage device 1000A (e.g., as illustrated in FIG. 10), taken along the I-I direction. Referring to FIGS. 10 and 12, the data storage board 200 is placed between dampers 400-1 and 400-2. The dampers 400-1 and 400-2 may absorb an external force so as to minimize the propagation of the external force to the data storage board 200.

The SUS plate 300 may be fixed to the bracket 500 to surround at least part of the data storage board 200. Since the SUS plate 300 may protect a certain portion of the data storage board 200, the SUS plate 300 minimizes bending of the data storage board 200 and also absorbs an external force applied to the data storage board 200, such as an impact.

Figure 13:
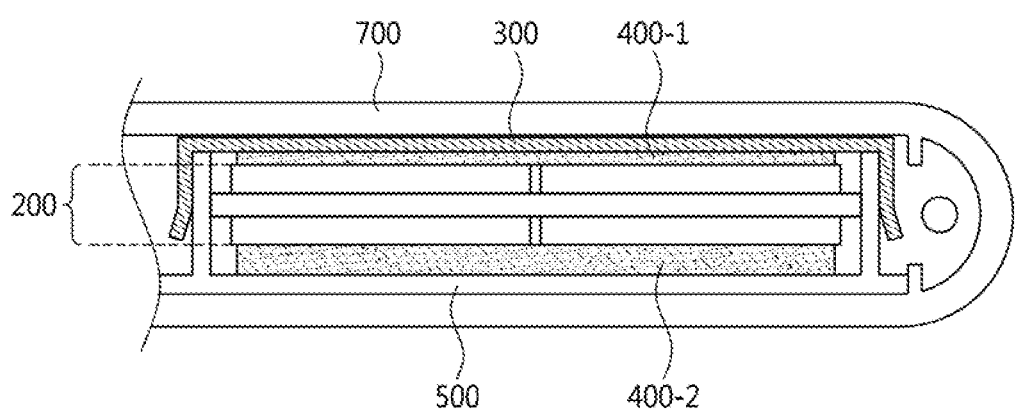
FIG. 13 is a cross-sectional view of the data storage device illustrated in FIG. 11, taken along the II-II direction, according to an exemplary embodiment of the present inventive concept.

FIG. 13 is a cross-sectional view of the data storage device 1000A (e.g., illustrated in FIG. 11), taken along the II-II direction. Referring to FIGS. 11 and 13, the data storage board 200 may be placed between dampers 400-1 and 400-2.

The SUS plate 300 may fix the data storage board 200 to the bracket 500. The data storage device 1000A including the SUS plate 300 is inserted into the case body 600, and the case cap 700 is coupled to the case body 600.

Figure 14:
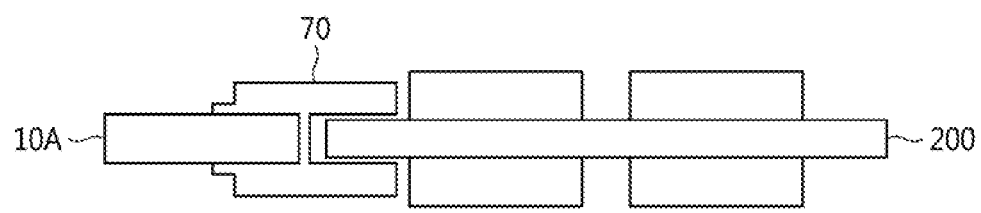
FIG. 14 is a diagram of the structure in which a data storage module illustrated in FIG. 6 is inserted into a connector, according to an exemplary embodiment of the present inventive concept.

FIG. 14 is a diagram of the structure in which a data storage module (e.g., as illustrated in FIG. 6) is inserted into a connector, e.g., the third connector 70. Referring to FIGS. 6 and 14, the data storage module 200 may be slid into and coupled to the third connector 70 included in the bridge board 10A and then connected to the first connector 30. Accordingly, the peripheral circuit 60 may communicate with the data storage module 200 through the first connector 30 and may communicate with the data storage module 200 through the third connector 70 when the peripheral circuit 60 cannot communicate with the data storage module 200 through the first connector 30.

As described above, according to exemplary embodiments of the present inventive concept, a data storage device has a bridge board modified to have a shape of, or similar to, a concave polygon therein, thereby allowing the center of a bridge board to be sturdily fixed at a bracket while sustaining the fundamental structure of an SSD module connected to the bridge board. Since the center of the bridge board is sturdily fixed at the bracket, the SSD module connected to the bridge board may also be sturdily fixed. As a result, bending of the SSD module is minimized when an external force is applied to the data storage device. Therefore, the mechanical reliability of the data storage device including the SSD module is increased.

When the shape of the bridge board is similar to a concave polygon or a similar shape, additional space allows for of the bridge board to be secured for a wide variety of differently shaped bridges. A SUS plate may be fixed to the bracket in the data storage device, so that the bridge board connected to the SSD module is prevented from bending or deviating from the shape and a force delivered to the SSD module is minimized.

While the present inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:

1. A bridge board comprising:
a printed circuit board (PCB);
a protocol converter mounted on the PCB to perform a conversion operation converting between a first communication protocol and a second communication protocol different from the first communication protocol;
a first connector configured to communicate according to the first communication protocol;
a second connector configured to communicate according to the second communication protocol; and
a hole formed in the PCB, wherein the PCB is shaped as a concave polygon, wherein the concave polygon comprises:
a first region comprising a first edge and a second edge, which extends in parallel to the first edge, along a first direction, and a second region comprising a third edge and a fourth edge, which extends in parallel to the third edge, along a second direction perpendicular to the first direction,
wherein a ratio of a second length of the second edge to a first length of the first edge is equal to or greater than 0.45 and equal to or less than 0.75,
wherein a ratio of a fourth length of the fourth edge to a third length of the third edge is equal to or greater than 0.35 and equal to or less than 0.7, and
wherein the bridge board further comprises a third connector disposed along the fourth edge.

2. The bridge board of claim 1, wherein the concave polygon is an L-shape, or a shape substantially similar to an L-shape.

3. The bridge board of claim 1, wherein the hole is formed in the second region, wherein the second region is defined by the third edge and the fourth edge and the second region comprises a fifth edge extending in the first direction, and a position of the hole corresponds to a ratio of a fifth length from the hole to the fifth edge to the third length is equal to or greater than 0.3 and equal to or less than 0.7.

4. The bridge board of claim 1, wherein the concave polygon is a U-shape, a shape substantially similar to a U-shape, and further comprises a third region comprising a fifth edge and a sixth edge, which extends in parallel to the fifth edge, along the second direction, wherein the second region and the third region are symmetrical to each other with respect to the second direction, and wherein the second length is a distance between the fourth edge and the sixth edge.

5. The bridge board of claim 1, wherein the first communication protocol is a serial advanced technology architecture (SATA) protocol and the second communication protocol is a universal serial bus (USB) protocol.

6. A data storage device comprising:
a bridge board comprising a first connector; and
a data storage board connected to the first connector,
wherein the bridge board comprises:
a printed circuit board (PCB);
a second connector;
a protocol converter mounted on the PCB to perform a conversion operation converting between a first communication protocol used by the first connector and a second communication protocol used by the second connector, the second communication protocol being different from the first communication protocol; and
a hole formed in the PCB, wherein the PCB has a shape of a concave polygon, wherein the concave polygon comprises:
a first region comprising a first edge and a second edge, which extends in parallel to the first edge, along a first direction, and a second region comprising a third edge and a fourth edge, which extends in parallel to the third edge, along a second direction perpendicular to the first direction,
wherein a ratio of a second length of the second edge to a first length of the first edge is equal to or greater than 0.45 and equal to or less than 0.75,
wherein a ratio of a fourth length of the fourth edge to a third length of the third edge is equal to or greater than 0.35 and equal to or less than 0.7, and
wherein the bridge board further comprises a third connector disposed along the fourth edge.

7. The data storage device of claim 6, wherein the data storage board is a mini serial advanced technology architecture (mSATA)-type solid state drive (SSD) module.

8. The data storage device of claim 6, further comprising a SUS plate surrounding at least part of the data storage board.

9. The data storage device of claim 6, wherein the hole is formed in the second region, wherein the second region is defined by the third edge and the fourth edge and the second region comprises a fifth edge extending in the first direction, and a ratio of a fifth length to the third length is equal to or greater than 0.3 and equal to or less than 0.7, wherein the fifth length is the length from the hole to the fifth edge.

10. The data storage device of claim 9, further comprising:
A screw; and
a bracket including a tapped hole, wherein the screw passes through the hole and is fastened to the tapped hole.

11. The data storage device of claim 6, wherein the data storage board comprises a plurality of non-volatile memory devices.

12. The data storage device of claim 11, wherein at least one of the non-volatile memory devices comprises a three-dimensional memory cell array.

13. The data storage device of claim 6, wherein the concave polygon is an L-shape, or a shape substantially similar to an L-shape.

14. The data storage device of claim 6, wherein the concave polygon is a U-shape, or a shape substantially similar to a U-shape, and further comprises a third region comprising a fifth edge and a sixth edge, which extends in parallel to the fifth edge, along the second direction, wherein the second region and the third region are symmetrical to each other with respect to the second direction, and wherein the second length is a distance between the fourth edge and the sixth edge.

15. The data storage device of claim 6, wherein the first communication protocol is a serial advanced technology architecture (SATA) protocol and the second communication protocol is a universal serial bus (USB) protocol.

16. A data storage device comprising:
a bridge board comprising a first connector;
at least one damper coupled to a data storage board, wherein the data storage board includes at least one hole; and
the data storage hoard connected to the first connector, wherein the bridge board comprises:
a printed circuit board (PCB);
a second connector;
a protocol converter mounted on the PCB to perform a conversion operation converting between a first communication protocol used by the first connector and a second communication protocol used by the second connector, the second communication protocol being different from the first communication protocol; and
a first hole formed in the PCB, wherein the PCB has a shape of a concave polygon, wherein the concave polygon comprises:
a first region comprising a first edge and a second edge, which extends in parallel to the first edge, along a first direction, and a second region comprising a third edge and a fourth edge, which extends in parallel to the third edge, along a second direction perpendicular to the first direction,
wherein a ratio of a second length of the second edge to a first length of the first edge is equal to or less than 0.75,
wherein a ratio of a fourth length of the fourth edge to a third length of the third edge is equal to or less than 0.7, and
wherein the bridge board further comprises a third connector disposed along the fourth edge.

17. The data storage device of claim 16, wherein the first hole is formed in the second region, wherein the second region is defined by the third edge and the fourth edge and the second region comprises a fifth edge extending in the first direction, and a ratio of a fifth length to the third length is equal to or less than 0.7, wherein the fifth length is the length from the first hole to the fifth edge.

18. The data storage device of claim 16, wherein the concave polygon is a U-shape, or a shape substantially similar to a U-shape, and further comprises a third region comprising a fifth edge and a sixth edge, which extends in parallel to the fifth edge, along the second direction, wherein the second length is a distance between the fourth edge and the sixth edge.

19. The data storage device of claim 18, wherein the second region and the third region are symmetrical to each other with respect to the second direction, and the third region comprises a second hole therein.

20. The data storage device of claim 16, wherein the third length is greater than the first length, and the fourth length is greater than the second length.

21. The bridge board of claim 1, wherein the third edge is perpendicular to the first edge, and the fourth edge is perpendicular to the second edge.

* * * * *